(12) United States Patent
Yang

(10) Patent No.: US 8,829,665 B2
(45) Date of Patent: Sep. 9, 2014

(54) SEMICONDUCTOR CHIP AND STACK PACKAGE HAVING THE SAME

(75) Inventor: Ju Heon Yang, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 739 days.

(21) Appl. No.: 12/980,927

(22) Filed: Dec. 29, 2010

(65) Prior Publication Data

US 2012/0007253 A1    Jan. 12, 2012

(30) Foreign Application Priority Data

Jul. 9, 2010   (KR) ................. 10-2010-0066537

(51) Int. Cl.
| | |
|---|---|
| H01L 21/44 | (2006.01) |
| H01L 23/535 | (2006.01) |
| H01L 23/00 | (2006.01) |
| H01L 23/48 | (2006.01) |
| H01L 25/065 | (2006.01) |
| H01L 23/522 | (2006.01) |
| H01L 23/31 | (2006.01) |

(52) U.S. Cl.
CPC .............. *H01L 23/535* (2013.01); *H01L 24/24* (2013.01); *H01L 2224/48227* (2013.01); *H01L 24/16* (2013.01); *H01L 2225/06565* (2013.01); *H01L 2224/73259* (2013.01); *H01L 24/73* (2013.01); *H01L 2924/01005* (2013.01); *H01L 23/3128* (2013.01); *H01L 23/481* (2013.01); *H01L 2225/06541* (2013.01); *H01L 24/06* (2013.01); *H01L 2224/92224* (2013.01); *H01L 25/0657* (2013.01); *H01L 24/92* (2013.01); *H01L 23/522* (2013.01); *H01L 2924/15311* (2013.01); *H01L 2924/01047* (2013.01); *H01L 2224/24145* (2013.01); *H01L 2924/01006* (2013.01); *H01L 2225/06551* (2013.01); *H01L 24/13* (2013.01); *H01L 2224/241* (2013.01); *H01L 2224/24221* (2013.01); *H01L 2224/245* (2013.01); *H01L 2224/16145* (2013.01); *H01L 2924/01075* (2013.01); *H01L 2924/014* (2013.01); *H01L 2924/01033* (2013.01); *H01L 2224/06183* (2013.01); *H01L 2225/0651* (2013.01); *H01L 2924/01029* (2013.01)
USPC .... 257/686; 257/690; 257/777; 257/E33.056; 257/E23.001; 438/616; 438/107

(58) Field of Classification Search
USPC .................. 257/686, 690, 734, 777, E33.056, 257/E23.001; 438/616, 107, 110
See application file for complete search history.

(56) References Cited

U.S. PATENT DOCUMENTS

| | | | |
|---|---|---|---|
| 6,780,770 B2 | 8/2004 | Larson | |
| 7,226,809 B2 * | 6/2007 | Poo et al. | ...................... 438/109 |

FOREIGN PATENT DOCUMENTS

| | | |
|---|---|---|
| JP | 2002-050735 A | 2/2002 |
| KR | 1020080111431 A | 12/2008 |
| WO | 2010057339 A1 | 5/2010 |

*Primary Examiner* — S. V. Clark
*Assistant Examiner* — Krista Soderholm
(74) *Attorney, Agent, or Firm* — William Park & Associates Patent Ltd.

(57) ABSTRACT

A semiconductor chip includes a semiconductor substrate with a top surface and a bottom surface. An active layer may be formed on the top surface of the semiconductor substrate and may comprise one or more signal pads and one or more chip selection pads on an upper surface of the active layer. First and second through electrodes may be formed to pass through the semiconductor substrate and the active layer, with the first through electrodes being electrically connected with the signal pads and the second through electrodes being electrically connected with the chip selection pads. A side electrode may be formed on a side surface of the semiconductor chip in such a way as to be connected with a second through electrode.

20 Claims, 6 Drawing Sheets

US 8,829,665 B2

SEMICONDUCTOR CHIP AND STACK PACKAGE HAVING THE SAME

CROSS-REFERENCE TO RELATED APPLICATIONS

The present application claims priority to Korean patent application number 10-2010-0066537 filed on Jul. 9, 2010, which is incorporated herein by reference in its entirety.

BACKGROUND OF THE INVENTION

The present invention relates to a stack package, and more particularly, to a semiconductor chip and a stack package having the same that allows chip selection to be easily conducted.

Stack packages in which a plurality of semiconductor chips are stacked to improve data storage capacity has been developed in a variety of shapes. One such stack package comprises, for example, a memory semiconductor chip and a system semiconductor chip stacked to improve data storage capacity and to increase data processing speed.

An example of such a stack package is stack package 100 which uses through-silicon vias (TSVs: hereinafter referred to as 'through electrodes') 30 as shown in FIG. 1. The stack package 100 using the through electrodes 30 has a structure in which the through electrodes 30 are formed in respective stacked semiconductor chips 20 such that electrical connections among the semiconductor chips 20 are formed by the through electrodes 30.

In FIG. 1, the unexplained reference numeral 10 designates a substrate, 12 bond fingers, 14 ball lands, 22 bonding pads, 40 an encapsulation member, and 50 solder balls.

In the case of a stack package using through electrodes, chip selection wires are needed for selectively driving the stacked semiconductor chips. In this regard, redistribution lines are conventionally used as chip selection lines. Redistribution lines for through electrodes are currently realized through a vertical passing method as shown in FIG. 2 or a method as shown in FIG. 3 in which additional lines 70 are formed and the additional lines 70 and the bond fingers 12 of the substrate 10 are bonded using conductive wires 80.

In FIGS. 2 and 3, the unexplained reference numerals 24, 32, and 60 designate chip selection pads, additional through electrodes, and redistribution lines, respectively.

However, in the conventional method shown in FIG. 2 for realizing the redistribution lines for through electrodes, a manufacturing procedure is complicated due to forming of the additional through electrodes and the redistribution lines on the respective semiconductor chips. Also, since a predetermined gap is needed between the semiconductor chips, the overall height of the stack package increases. Also, in the conventional method shown in FIG. 3 for realizing the redistribution lines for through electrodes, since additional space for wire bonding is needed, the size of the stack package increases.

BRIEF SUMMARY OF THE INVENTION

An embodiment of the present invention is directed to a semiconductor chip that allows chip selection in a stack package of a plurality of semiconductor chips.

Also, an embodiment of the present invention is directed to a stack package that allows selection of one of the stacked semiconductor chips.

In one embodiment of the present invention, a semiconductor chip may include: a semiconductor substrate having a top surface and a bottom surface; an active layer formed on the top surface of the semiconductor substrate and having one or more signal pads and one or more chip selection pads disposed on an upper surface of the active layer; first and second through electrodes formed to pass through the semiconductor substrate and the active layer, the first through electrodes being electrically connected with the signal pads and the second through electrodes being electrically connected with the chip selection pads; and a side electrode formed on a side surface of any one of the semiconductor substrate and the active layer in such a way as to be connected with any one second through electrode.

In the case where the side electrode is formed in the semiconductor substrate, the side electrode may be formed to be disposed at a depth of approximately 10 μm to approximately 25 μm when measured from the top surface of the semiconductor substrate.

In the case where the side electrode is formed in the active layer, the side electrode may be formed to be connected with the second through electrode from the side surface of the active layer.

The side electrode formed in the active layer may include any one metal line among a plurality of metal lines that are formed in the active layer. The metal line may be connected with the second through electrode and may extend to the side surface of the active layer.

The first and second through electrodes may be formed to vertically pass through the signal pads and the chip selection pads, and also through portions of the active layer and the semiconductor substrate that are placed under the signal pads and the chip selection pads.

The first and second through electrodes may be formed to vertically pass through portions of the active layer and the semiconductor substrate that are separated from the signal pads and the chip selection pads.

The semiconductor chip may further include redistribution lines formed to electrically connect the first and second through electrodes with respective signal pads and chip selection pads.

The active layer and the semiconductor substrate, which are formed with the first and second through electrodes, may include a circuit section and a scribe lane section that surrounds the circuit section.

The first and second through electrodes may be in the circuit section and/or in the scribe lane section.

In another embodiment of the present invention, a stack package may include: at least two semiconductor chips each including a semiconductor substrate having a top surface and a bottom surface, an active layer formed on the top surface of the semiconductor substrate and having one or more signal pads and one or more chip selection pads disposed on an upper surface of the active layer, first and second through electrodes formed to pass through the semiconductor substrate and the active layer, the first through electrodes being electrically connected with the signal pads and the second through electrodes being electrically connected with the chip selection pads, and a side electrode formed on a side surface of any one of the semiconductor substrate and the active layer in such a way as to be connected with any one second through electrode, the semiconductor chips being stacked in such a manner that first through electrodes of a semiconductor chip are electrically connected with corresponding first through electrodes of the other semiconductor chips; and connection lines formed on side surfaces of the stacked semiconductor chips and each connected with the side electrode of any one semiconductor chip among the stacked semiconductor chips.

The stack package may further include a substrate having a top surface on which the stacked semiconductor chips are mounted and a bottom surface, and including first connection pads to be connected with the first through electrodes and second connection pads to be connected with the connection lines, which are disposed on the top surface of the substrate, and third connection pads, which are disposed on the bottom surface of the substrate; an encapsulation member formed over the top surface of the substrate to cover the stacked semiconductor chips; and external mounting members attached to the third connection pads disposed on the bottom surface of the substrate.

The connection lines may be formed on the side surfaces of the stacked semiconductor chips to have the same length.

The connection lines may also be formed to have different lengths such that the connection lines can extend from the bottom surface of a lowermost semiconductor chip among the stacked semiconductor chips and reach respective corresponding side electrodes to be connected therewith.

Each of the connection lines may include any one of a conductive pattern, a conductive wire, a conductive ink and a conductive polymer.

DESCRIPTION OF SPECIFIC EMBODIMENTS

Hereafter, specific embodiments of the present invention will be described in detail with reference to the accompanying drawings.

It is to be understood herein that the drawings are not necessarily to scale and in some instances proportions may have been exaggerated in order to more clearly depict certain features of the invention.

Figure 1:
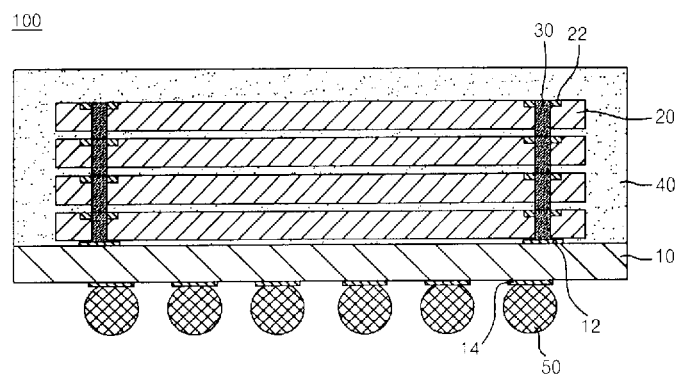
FIG. 1 is a cross-sectional view illustrating a conventional stack package.
Figure 2:
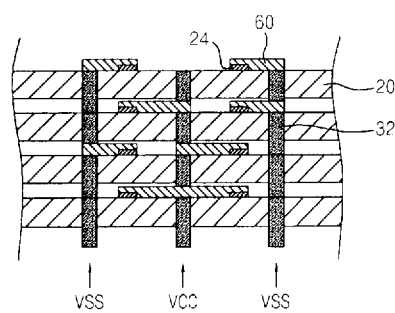
FIGS. 2 and 3 are cross-sectional views illustrating chip selection schemes in the conventional stack package.
Figure 3:
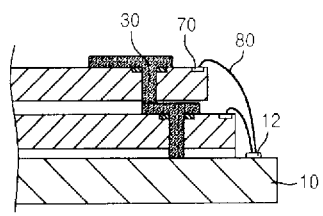
Figure 4:
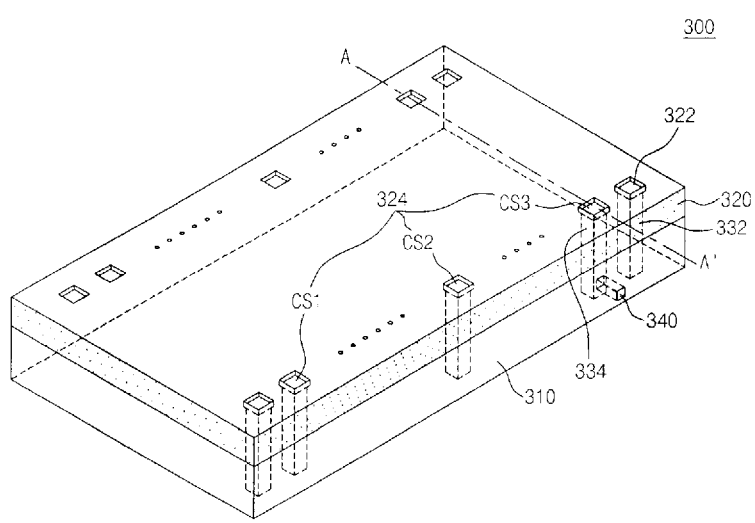
FIG. 4 is a perspective view illustrating a semiconductor chip in accordance with an embodiment of the present invention.
Figure 5:
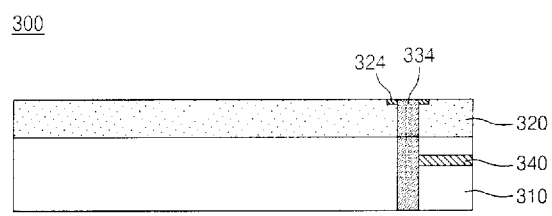
FIG. 5 is a cross-sectional view taken along the line A-A' of FIG. 4.

FIG. 4 is a perspective view illustrating a semiconductor chip in accordance with an embodiment of the present invention, and FIG. 5 is a cross-sectional view taken along the line A-A' of FIG. 4.

Referring to FIGS. 4 and 5, a semiconductor chip 300 in accordance with an embodiment of the present invention includes a semiconductor substrate 310, an active layer 320, signal through electrodes 332 and chip select through electrodes 334, and a side electrode 340. The signal through electrodes 332 and chip select through electrodes 334 may be collectively referred to as through electrodes 332 and 334.

The semiconductor substrate 310 has a top surface and a bottom surface. The semiconductor chip 310 also has, for example, the shape of a quadrangular plate and may be, for example, from approximately 50 μm to approximately 760 μm thick.

The active layer 320 is formed on the top surface of the semiconductor substrate 310. The active layer 320 includes a plurality of signal pads 322 and a plurality of chip selection pads 324 disposed on the upper surface. While not shown in a drawing, the active layer 320 can be understood as being formed with various elements including multiple layers of metal lines.

The signal pads 322 and the chip selection pads 324 can be disposed, for example, along edges of the active layer 320. The signal pads 322 may include pads for power and ground signals, and also for various operating signals. As shown in FIG. 4, at least three chip selection pads 324 may be disposed along the one edge of the active layer 320. In the present embodiment, the chip selection pads 324 are disposed along the one edge of the active layer 320 by the number of 3. In FIG. 4, the three chip selection pads 324 are denoted as first, second and third chip selection pads CS1, CS2 and CS3.

The through electrodes 332 and 334 are formed to pass through the semiconductor substrate 310 and the active layer 320. The signal through electrodes 332 are electrically connected with the signal pads 322 and the chip select through electrodes 334 are electrically connected with the chip selection pads 324. In the present embodiment, the through electrodes 332 and 334 are formed to pass through the signal pads 322 and the chip selection pads 324, respectively, and portions of the active layer 320 and the semiconductor substrate 310 that are placed under the signal pads 322 and the chip selection pads 324.

While not shown in a drawing, it is conceivable that the first and second through electrodes 332 and 334 may be formed to vertically pass through portions of the active layer 320 and the semiconductor substrate 310 that are separated from the signal pads 322 and the chip selection pads 324. In this case, the through electrodes 332 and 334 can be understood as being respectively connected with the corresponding signal pads 322 and the corresponding chip selection pads 324 through additional formation of redistribution lines.

The side electrode 340 may be formed to be connected with any one of the chip select through electrodes 334 that are connected with the corresponding chip selection pads CS1, CS2 and CS3.

In the present embodiment, the side electrode 340 is formed at a depth from approximately 10 μm to approximately 25 μm when measured from the top surface of the semiconductor substrate 310. Further, the side electrode 340 is horizontally formed to reach a chip select through electrode 334 from the side surface of the semiconductor substrate 310. The side electrode 340 can be formed by defining a via through etching the side surface of the semiconductor substrate 310 in such a way as to expose any one of the chip select through electrodes 334 and then filling the via with a conductive layer such as, for example, a copper layer.

Figure 6:
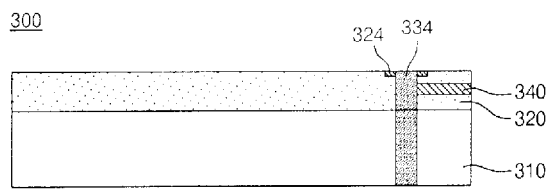
FIG. 6 is a cross-sectional view illustrating a variation of the semiconductor chip in accordance with the embodiment of the present invention.

The side electrode 340 can also be formed in the active layer 320 as shown in FIG. 6. In this case, the side electrode 340 can be formed by defining a via through etching the side surface of the active layer 320 in such a way as to expose any one of the chip select through electrodes 334 and then filling the via with a conductive layer such as, for example, a copper layer.

While not shown in a drawing, when forming the side electrode 340 on the side surface of the semiconductor substrate 310 or the active layer 320, after stacking a predetermined number of semiconductor chips 300 on a glass substrate, vias may be defined by simultaneously etching semiconductor substrates 310 or active layers 320 of the respective semiconductor chips 300. Accordingly, side electrodes 340 may be simultaneously formed in the respective semiconductor chips 300 by filling a conductive layer such as a copper layer in the vias. A plurality of separate semiconductor chips 300 with the respective side electrodes 340 may then be realized by separating the semiconductor chips 300.

While not shown in a drawing, any one metal line among a plurality of metal lines formed in the active layer 320 may be connected to any one of the chip select through electrodes 334. The metal line may be extended to the side surface of the active layer 320, and the extended metal line can then be used as the side electrode 340.

Although the side electrodes 340 are described as being used with the chip select through electrodes 334, the invention need not be so limited. The side electrodes 340 may also be with, for example, for the signal through electrodes 332.

In the semiconductor chip 300 in accordance with an embodiment of the present invention, while not shown in detail, the active layer 320 and the semiconductor substrate 310 may be formed such that the through electrodes 332 and 334 include a circuit section formed with various devices and a scribe lane section that surrounds the circuit section. Accordingly, the through electrodes 332 and 334 can be formed to be disposed in the circuit section or the scribe lane section.

In the case where the through electrodes 332 and 334 are formed in the circuit section, the through electrodes 332 and 334 can be formed to pass through the signal pads 322 and the chip selection pads 324. The through electrodes 332 and 334 may also be separated from the signal pads 322 and the chip selection pads 324. When the through electrodes 332 and 334 are formed to be separated from the signal pads 322 and the chip selection pads 324, the through electrodes 332 and 334 can be electrically connected with the signal pads 322 and the chip selection pads 324 by redistribution lines. Alternately, in the case where the through electrodes 332 and 334 are formed in the scribe lane section, the through electrodes 332 and 334 can be electrically connected with the signal pads 322 and the chip selection pads 324 by redistribution lines.

Figure 7:
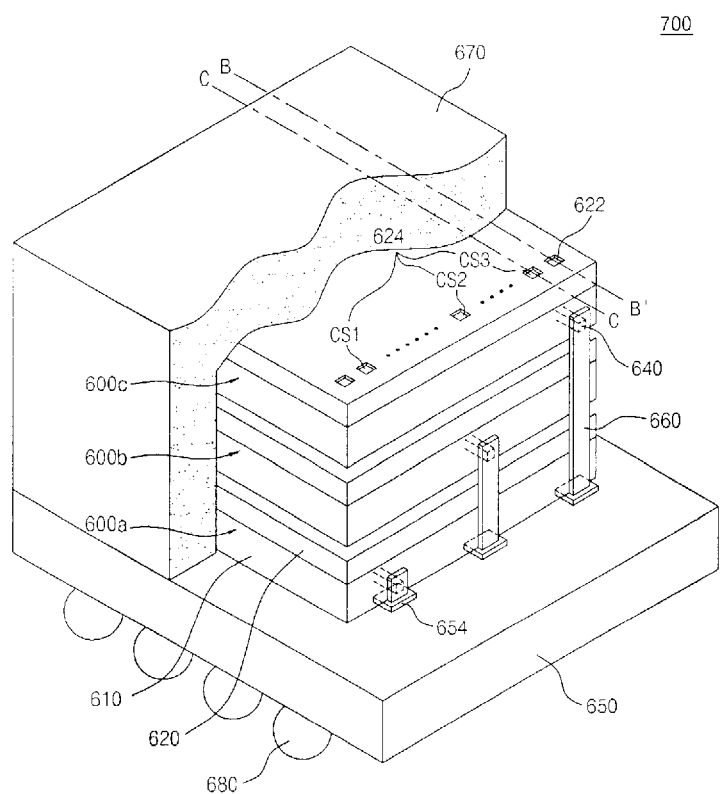
FIG. 7 is a partially broken-away perspective view illustrating a stack package in accordance with another embodiment of the present invention.
Figure 8:
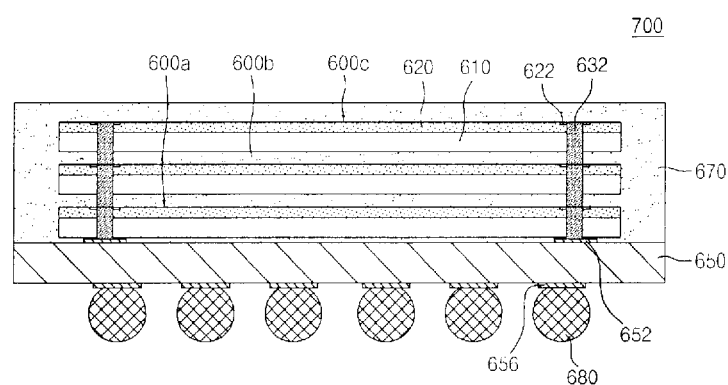
FIG. 8 is a cross-sectional view taken along the line B-B' of FIG. 7.
Figure 9:
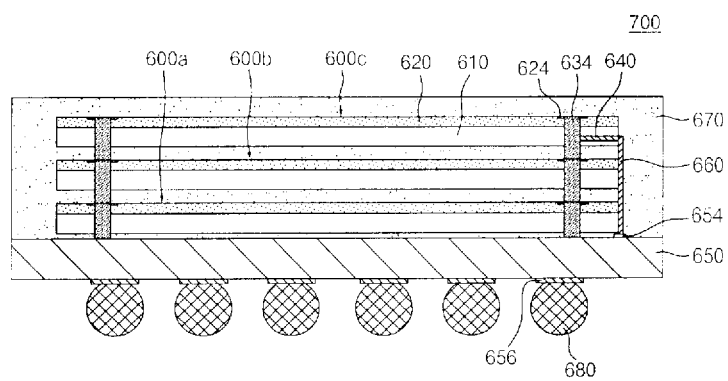
FIG. 9 is a cross-sectional view taken along the line C-C' of FIG. 7.

FIG. 7 is a partially broken-away perspective view illustrating a stack package in accordance with another embodiment of the present invention, FIG. 8 is a cross-sectional view taken along the line B-B' of FIG. 7, and FIG. 9 is a cross-sectional view taken along the line C-C' of FIG. 7.

Referring to FIGS. 7 through 9, a stack package 700 in accordance with another embodiment of the present invention includes a substrate 650, stacked semiconductor chips 600a, 600b and 600c, connection lines 660, an encapsulation member 670, and external mounting members 680.

The substrate 650 comprises a top surface and a bottom surface. The substrate 650 includes first connection pads 652 (FIG. 8) and second connection pads 654 (FIGS. 7 and 9) disposed on the top surface and third connection pads 656 (FIGS. 8 and 9) are disposed on the bottom surface. In the present embodiment, the substrate 650 has an area that is larger than each of the semiconductor chips 600a, 600b and 600c.

The first connection pads 652 are disposed to be respectively connected with first through electrodes 632 formed in the semiconductor chip 600a which is positioned lowermost among the stacked semiconductor chips 600a, 600b and 600c. The second connection pads 654 are disposed to be respectively connected with side electrodes 640 of the stacked semiconductor chips 600a, 600b and 600c. Further, it can be understood that the first connection pads 652 are disposed on the top surface of the substrate 650 in such a way as not to correspond to second through electrodes 634.

While not shown in detail in FIG. 7, each of the stacked semiconductor chips 600a, 600b and 600c includes a semiconductor substrate 610 that has a top surface and a bottom surface and an active layer 620 which is formed on the top surface of the semiconductor substrate 610. The active layer 620 includes a plurality of signal pads 622 and a plurality of chip selection pads 624 disposed on the upper surface. The first and second through electrodes 632 and 634 are formed in the semiconductor chips 600a, 600b and 600c, in such a way as to be connected with the respective signal pads 622 and the respective chip selection pads 624 and pass through the active layer 620 and the semiconductor substrate 610. The side electrodes 640 are formed in the semiconductor chips 600a, 600b and 600c in such a way as to each be connected with any one of the second through electrodes 634 connected with the chip selection pads 624.

Each side electrode 640 may be formed in the semiconductor substrate 610 and/or the active layer 620. For example, the side electrode 640 may be formed by defining a via through etching the semiconductor substrate 610 and/or the active layer 620 in such a way as to expose any one of the second through electrodes 634. The via may then be filled with a conductive layer such as a copper layer such that the side electrode 640 is connected with the exposed second through electrode 634.

In an embodiment of the invention, the side electrode 640 is formed in the semiconductor substrate 610. Also, for the semiconductor 600a the side electrodes 640 are formed, for example, in such a way as to be connected with one of the second through electrodes 634 connected with a first chip selection pad CS1. Another of the second through electrodes 634 may be connected with a second chip selection pad CS2 in the semiconductor chip 600b. Another of the second through electrodes 634 may be connected with a third chip selection pad CS3 in the semiconductor chip 600c.

Each of the side electrodes 640 may be formed using any one of a multiple layers of metal lines that are in the active layer 620, without being additionally formed. In this case, the side electrode 640 can be realized by extending each of the metal lines to the side surface of the active layer 620 while being connected with any of the second through electrodes 634, for any of the semiconductor chips 600a, 600b and 600c.

While not shown in detail, the active layer 620 and the semiconductor substrate 610 formed with the first and second through electrodes 632 and 634 include a circuit section that is formed with various devices and a scribe lane section that surrounds the circuit section. The first and second through electrodes 632 and 634 can be formed in the circuit section or the scribe lane section. In the case where the first and second through electrodes 632 and 634 are formed in the circuit section, the first and second through electrodes 632 and 634 can be formed to pass through the signal pads 622 and the chip selection pads 624 or to be separated from the signal pads 622 and the chip selection pads 624. When the first and second through electrodes 632 and 634 are formed to be separated from the signal pads 622 and the chip selection pads 624, the first and second through electrodes 632 and 634 can be electrically connected with the signal pads 622 and the chip selection pads 624 by redistribution lines. In the case where the first and second through electrodes 632 and 634 are formed in the scribe lane section, the first and second through electrodes 632 and 634 can be electrically connected with the signal pads 622 and the chip selection pads 624 by redistribution lines.

In an embodiment of the invention, the semiconductor chips 600a, 600b and 600c may be vertically stacked on the top surface of the substrate 650. The respective semiconductor chips 600a, 600b and 600c are stacked in such a manner that the first and second through electrodes 632 and 634 are connected with one another. Also, the respective semiconductor chips 600a, 600b and 600c are stacked in such a manner that the respective side electrodes 640 are disposed along different vertical lines.

The connection lines 660 are formed on the side surfaces of the stacked semiconductor chips 600a, 600b and 600c. The respective connection lines 660 are formed in such a way as to connect the side electrodes 640 of the respective corresponding semiconductor chips 600a, 600b and 600c with the second connection pads 654 of the substrate 650. For example, each of the connection lines 660 may comprise any one of a conductive pattern, a conductive ink and a conductive polymer. Also, each of the connection lines 660 may comprise a conductive wire. The connection lines 660 are formed to have different lengths so as to be connected with the side electrodes 640 of the respective corresponding semiconductor chips 600a, 600b and 600c. While not shown in a drawing, the connection lines 660 can be formed to have the same length and be connected with the corresponding side electrodes 640 of the respective semiconductor chips 600a, 600b and 600c.

The encapsulation member 670 is formed on the top surface of the substrate 650 in such a way as to cover the stacked semiconductor chips 600a, 600b and 600c. The encapsulation member 670 may comprise, for example, an EMC (epoxy molding compound). While not shown in a drawing, underfill members rather than an encapsulation member 670 may be disposed in spaces between the stacked semiconductor chips 600a, 600b and 600c.

The external mounting members 680 may include, for example, solder balls. The external mounting members 680 are respectively attached to the third connection pads 656 that are disposed on the other surface of the substrate 650.

While various embodiments of the invention have shown three chips stacked together for exemplary purposes, it should be understood that two or more chips may be stacked together.

As is apparent from the above description, in the present invention, a semiconductor chip is constructed in a manner such that a through electrode is vertically formed to be coupled with a chip selection pad and a side electrode is horizontally formed to be coupled with the through electrode. A stack package is realized in a manner such that semiconductor chips are stacked on a substrate and side electrodes, which are exposed on the side surfaces of the respective semiconductor chips, are electrically connected with the substrate.

Accordingly, it can be seen in the various embodiments of the invention that it is not necessary to define a space for forming redistribution lines for chip selection in the respective stacked semiconductor chips, and, therefore, the overall size and height of the stack package can be decreased.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A semiconductor chip comprising:
    an active layer formed on a top surface of a semiconductor substrate, the active layer comprising one or more pads disposed on an upper surface of the active layer;
    through electrodes formed to pass through the semiconductor substrate and the active layer; and
    a side electrode horizontally formed in the semiconductor chip and extended to a side surface of the semiconductor chip so as to be connected with any one through electrode from the side surface of the semiconductor chip.

2. The semiconductor chip according to claim 1, wherein the through electrodes are electrically connected with the pads.

3. The semiconductor chip according to claim 1, wherein the side electrode is formed in the semiconductor substrate.

4. The semiconductor chip according to claim 3, wherein the side electrode is at a depth of substantially 10 μm to substantially 25 μm when measured from the top surface of the semiconductor substrate.

5. The semiconductor chip according to claim 1, wherein the side electrode is formed in the active layer.

6. The semiconductor chip according to claim 1, wherein the side electrode formed in the active layer comprises any one metal line among a plurality of metal lines formed in the active layer.

7. The semiconductor chip according to claim 6, wherein the any one metal line is connected with the through electrode and extends to a side surface of the active layer.

8. The semiconductor chip according to claim 1, wherein the through electrodes are formed to vertically pass through the pads, and through portions of the active layer and the semiconductor substrate under the pads.

9. The semiconductor chip according to claim 1, wherein the through electrodes are formed to vertically pass through portions of the active layer and the semiconductor substrate that are separated from the pads.

10. The semiconductor chip according to claim 9, further comprising:
    redistribution lines formed to electrically connect the through electrodes with respective pads.

11. The semiconductor chip according to claim 1, wherein the active layer and the semiconductor substrate which are formed with the through electrodes comprising a circuit section and a scribe lane section which surrounds the circuit section.

12. The semiconductor chip according to claim 11, wherein the through electrodes are disposed in the circuit section.

13. The semiconductor chip according to claim 11, wherein the through electrodes are disposed in the scribe lane section.

14. A stack package comprising:
    at least two semiconductor chips wherein each semiconductor chip comprises a semiconductor substrate having a top surface and a bottom surface and an active layer formed on the top surface of each semiconductor substrate and having one or more pads disposed on an upper surface of the active layer, through electrodes formed to pass through the semiconductor substrate and the active layer, the through electrodes being electrically connected with pads, and a side electrode horizontally formed in the semiconductor chip and extended to a side surface of each semiconductor chips so as to be connected with any one through electrode from the side surface of the semiconductor chip, the semiconductor chips being stacked such that through electrodes of each semiconductor chip are electrically connected with corresponding through electrodes of the other chips; and
    connection lines formed on side surfaces of the stacked semiconductor chips and each connected with the side electrode of any one semiconductor chip among the stacked semiconductor chips.

15. The stack package according to claim 14, further comprising:
   a substrate having a top surface on which the at least two semiconductor chips are mounted and a bottom surface, first connection pads which are connected with the through electrodes and second connection pads which are connected with the connection lines, which are disposed on the top surface of the substrate, and third connection pads, which are disposed on the bottom surface of the substrate;
   an encapsulation member formed over the top surface of the substrate to cover the stacked semiconductor chips; and
   external mounting members attached to the third connection pads disposed on the bottom surface of the substrate.

16. The stack package according to claim 14, wherein the connection lines are formed to have the same length.

17. The stack package according to claim 14, wherein the connection lines are formed to have different lengths such that the connection lines can extend from the bottom surface of a lowermost semiconductor chip to be able to be connected to corresponding side electrodes.

18. The stack package according to claim 14, wherein each of the connection lines comprises any one of a conductive pattern, a conductive wire, a conductive ink and a conductive polymer.

19. The semiconductor chip according to claim 1,
   wherein the pads comprise one or more signal pads and one or more chip selection,
   wherein the through electrodes comprise first through electrodes being electrically connected with the signal pads and second through electrodes being electrically connected with the chip selection pads.

20. The semiconductor chip according to claim 14,
   wherein the pads comprise one or more signal pads and one or more chip selection,
   wherein the through electrodes comprise first through electrodes being electrically connected with the signal pads and second through electrodes being electrically connected with the chip selection pads.

* * * * *